(12) United States Patent
Kelly et al.

(10) Patent No.: US 9,054,213 B2
(45) Date of Patent: Jun. 9, 2015

(54) FINFET WITH METAL GATE STRESSOR

(71) Applicant: Taiwan Semiconductor Manufacturing Company, Ltd., Hsin-Chu (TW)

(72) Inventors: Andrew Joseph Kelly, Hengshan Township (TW); Yasutoshi Okuno, Hsin-Chu (TW); Pei-Shan Chien, Keelung (TW); Wei-Hsiung Tseng, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/502,925

(22) Filed: Sep. 30, 2014

(65) Prior Publication Data

US 2015/0056774 A1    Feb. 26, 2015

Related U.S. Application Data

(62) Division of application No. 13/425,218, filed on Mar. 20, 2012, now Pat. No. 8,872,284.

(51) Int. Cl.
| | |
|---|---|
| *H01L 29/78* | (2006.01) |
| *H01L 21/8234* | (2006.01) |
| *H01L 21/285* | (2006.01) |

(52) U.S. Cl.
CPC .... *H01L 21/823431* (2013.01); *H01L 29/7845* (2013.01); *H01L 21/823481* (2013.01); *H01L 21/823437* (2013.01); *H01L 21/28556* (2013.01)

(58) Field of Classification Search
CPC ............ H01L 29/785; H01L 29/66636; H01L 29/66795; H01L 29/78687; H01L 21/823807; H01L 21/845; H01L 27/1211; H01L 29/66628; H01L 29/7834; H01L 21/823412; H01L 21/823418; H01L 21/823814
USPC .......................................... 257/402; 438/592
See application file for complete search history.

(56) References Cited

U.S. PATENT DOCUMENTS

| | | | |
|---|---|---|---|
| 7,193,279 B2 * | 3/2007 | Doyle et al. | 257/401 |
| 7,709,312 B2 | 5/2010 | Jin et al. | |
| 8,421,059 B2 | 4/2013 | Datta et al. | |
| 2011/0079852 A1 | 4/2011 | Lander | |
| 2011/0272738 A1 * | 11/2011 | Oh et al. | 257/190 |
| 2011/0272739 A1 | 11/2011 | Lee et al. | |
| 2012/0018730 A1 * | 1/2012 | Kanakasabapathy et al. | 257/66 |

FOREIGN PATENT DOCUMENTS

| | | |
|---|---|---|
| KR | 2005118717 A | 12/2005 |
| KR | 100845175 B1 | 7/2008 |
| KR | 20110123194 A | 11/2011 |
| WO | 2004093197 A2 | 10/2004 |
| WO | 2005098963 A1 | 10/2005 |

* cited by examiner

*Primary Examiner* — David Vu
*Assistant Examiner* — Jonathan Han
(74) *Attorney, Agent, or Firm* — Slater & Matsil, L.L.P

(57) ABSTRACT

A gate stressor for a fin field effect transistor (FinFET) device is provided. The gate stressor includes a floor, a first stressor sidewall, and a second stressor sidewall. The floor is formed on a first portion of a gate layer. The gate layer is disposed above a shallow trench isolation (STI) region. The first stressor sidewall formed on a second portion of the gate layer. The second portion of the gate layer is disposed on sidewalls of a fin. The second stressor sidewall formed on the third portion of the gate layer. The third portion of the gate layer is disposed on sidewalls of a structure spaced apart from the fin. The first stressor side wall and the second stressor sidewall do not exceed a height of the fin.

20 Claims, 13 Drawing Sheets

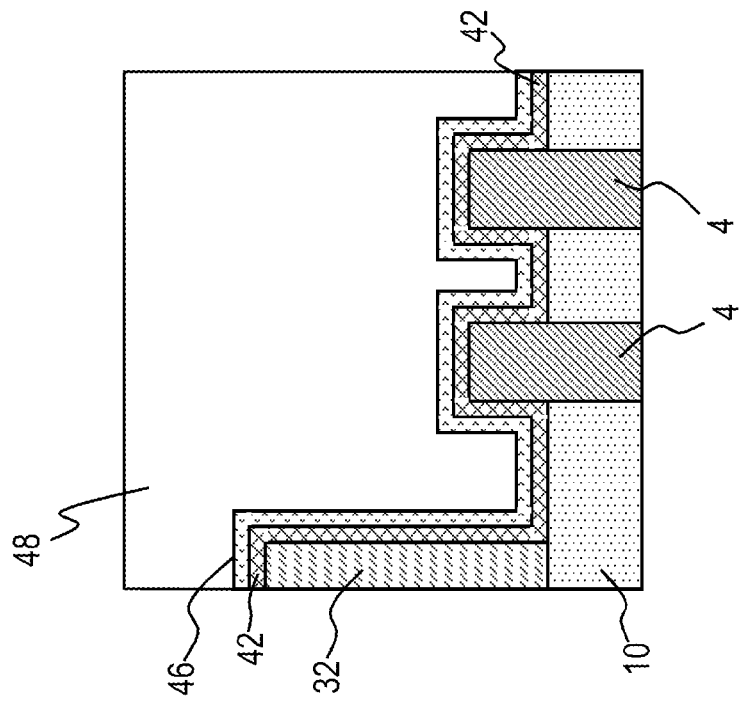
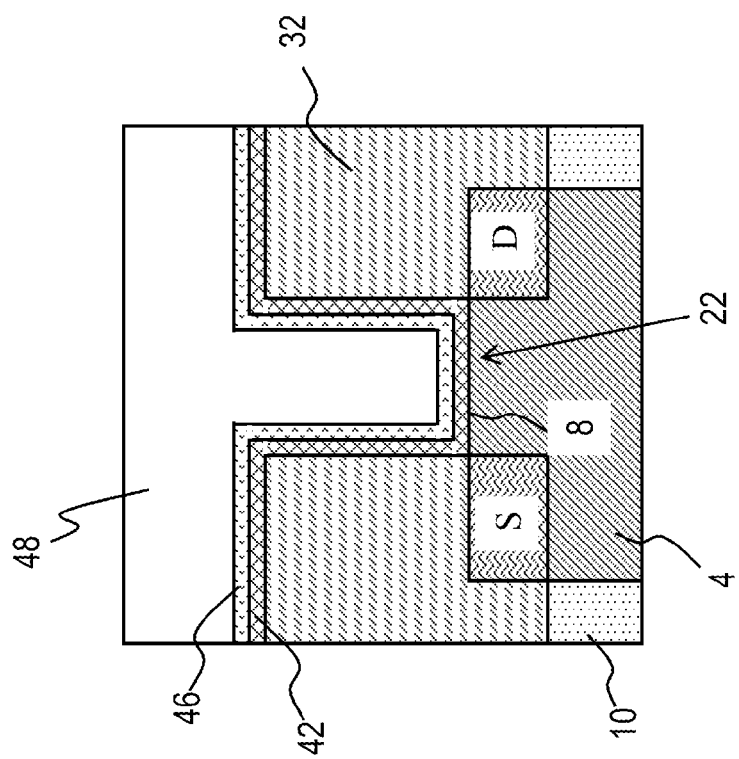
Fig. 7a
Fig. 7b

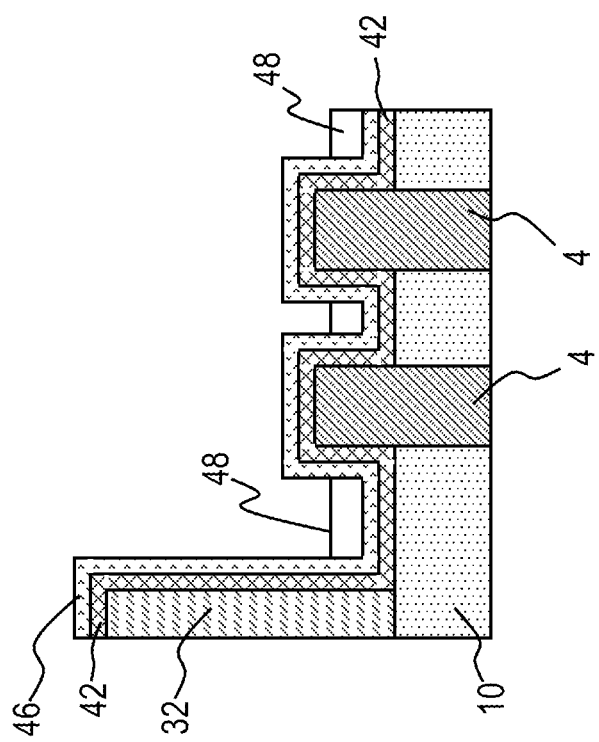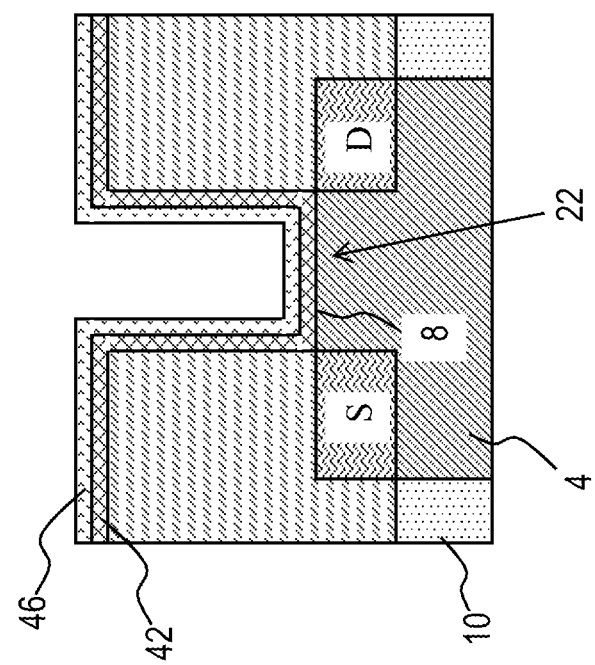
Fig. 8a
Fig. 8b

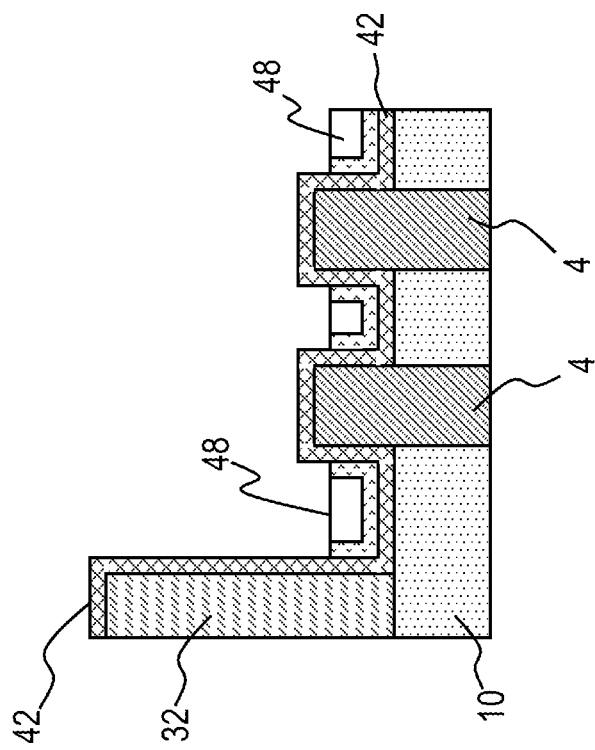
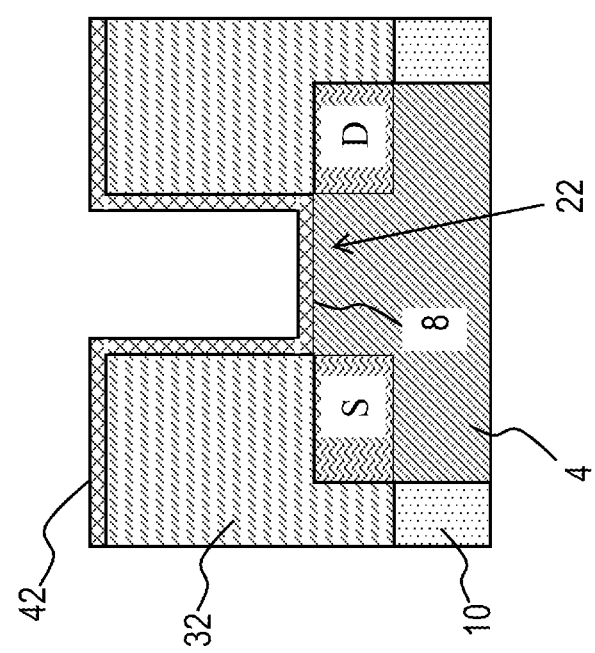
Fig. 9a
Fig. 9b

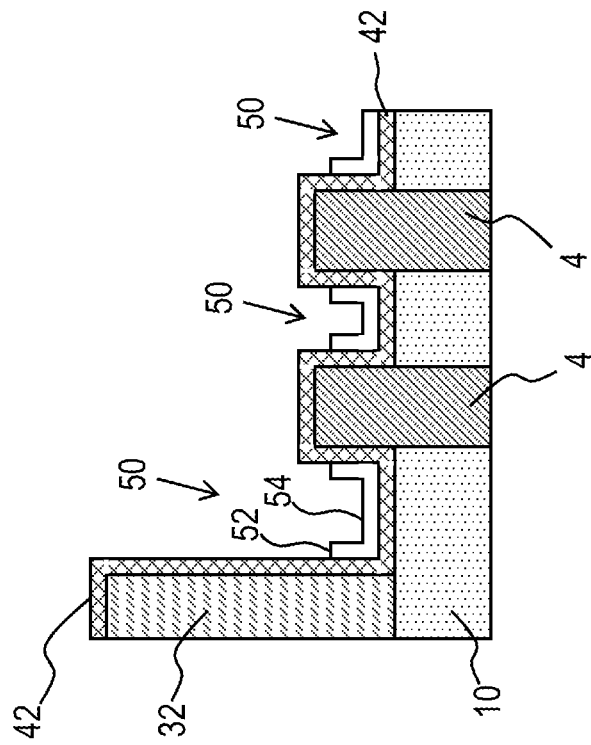
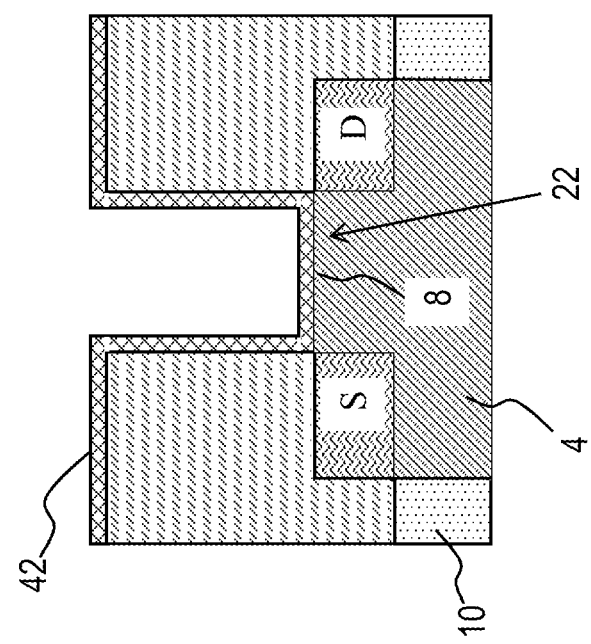
Fig. 10b
Fig. 10a

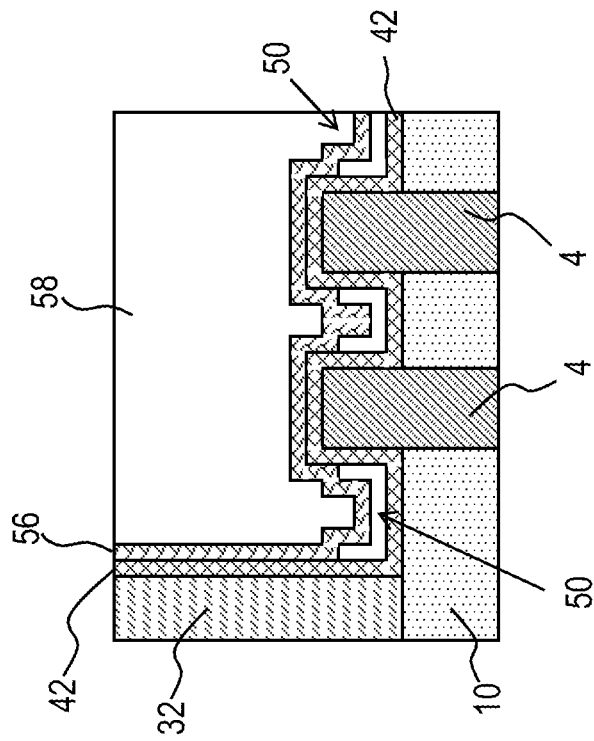
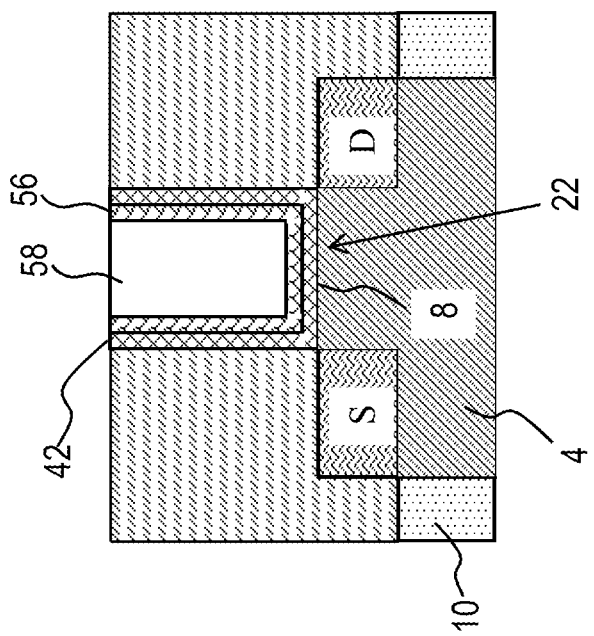
Fig. 11a
Fig. 11b

FINFET WITH METAL GATE STRESSOR

This application is a divisional of U.S. patent application Ser. No. 13/425,218, entitled "FinFET with Metal Gate Stressor," filed on, Mar. 20, 2012, which is incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density but also improve gate control of the channel.

In recent years, FinFETs have been constructed using a replacement gate process. During such process, the FinFET is initially provided with polysilicon gates, which are better able to withstand the more severe processing conditions of the immediately subsequent processing operations. Thereafter, in later stages of processing when processing conditions are less severe, the polysilicon gates are removed from the FinFET structures and replaced with permanent metal gates.

The replacement gate process, as it is known, also carries with it limitations that become an even greater concern as technologies advance, integration levels increase, and feature sizes become smaller.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 11a-11b are cross sectional views showing an embodiment of processing operations employed to form a work function metal over the gate stressor of FIG. 10b;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a FinFET metal oxide semiconductor (MOS). The invention may also be applied, however, to other integrated circuits, electronic structures, and the like.

Figure 1:
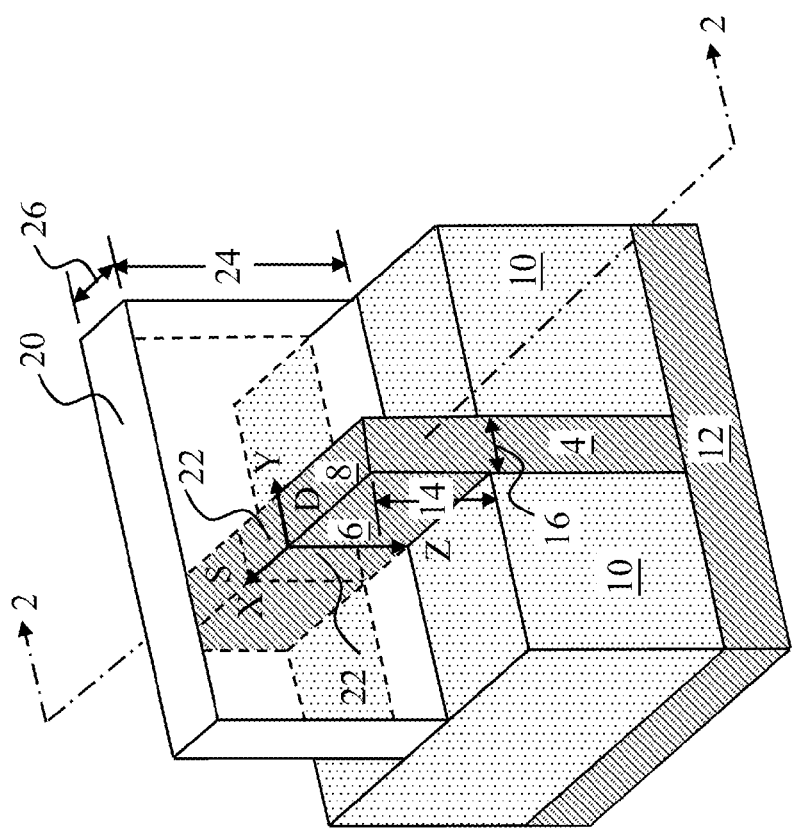
FIG. 1 is a perspective, three dimensional view in partial cross-section illustrating a sacrificial gate formed over a semiconductor fin.

FIG. 1 is a perspective, three-dimensional view in partial cross-section illustrating a sacrificial gate formed over a semiconductor fin. Semiconductor fin 4 is formed over substrate 12 using known techniques. Semiconductor fin 4 may be formed of silicon, silicon-germanium, germanium or other suitable semiconductor materials. Semiconductor fin 4 includes opposed sides 6 and top 8 and is disposed between STI (shallow trench isolation) structures 10. Semiconductor fin 4 includes width 16 which may vary from about 5 nm to about 50 nm. Height 14 may range from about 5 nm to about 50 nm. The overall height of semiconductor fin 4, i.e., the distance between top 8 and the interface between semiconductor fin 4 and substrate 12, may be about 60 nm to about 90 nm, but various other dimensions may be used in other embodiments. Various suitable substrates may be used as substrate 12.

A transistor channel 22 (a.k.a., a gate channel) is defined along top 8 and sides 6 of semiconductor fin 4 and extends between the source S and drain D regions. A transistor such as a FinFET transistor may be formed along semiconductor fin 4 utilizing the transistor channel 22. Sacrificial gate 20 is illustrated in FIG. 1 and may be formed of polysilicon or other non-metal materials that are durable and thermally robust but easily removable. Any of various known methods for forming the structure shown in FIG. 1 may be used. Sacrificial gate 20 includes width 26 and height 24, with width 26 substantially serving as the channel length for transistor channel 22. According to various exemplary embodiments, height 24 may range from about 75-120 nm and may be about 90 nm in one advantageous embodiment and width 26 may be about 22 nm in one exemplary embodiment, but may alliteratively range from about 5 nm to about 50 nm in other exemplary embodiments. Sacrificial gate 20 extends along sides 6 and top 8 of semiconductor fin 4 and also extends laterally past opposed sides 6. Although not visible in FIG. 1, a hard mask may advantageously be formed under sacrificial gate 20 and on the surfaces of sides 6 and top 8 that form transistor channel 22, i.e., at the interface between sacrificial gate 20 and semiconductor fin 4 (see FIG. 2).

Figure 2:
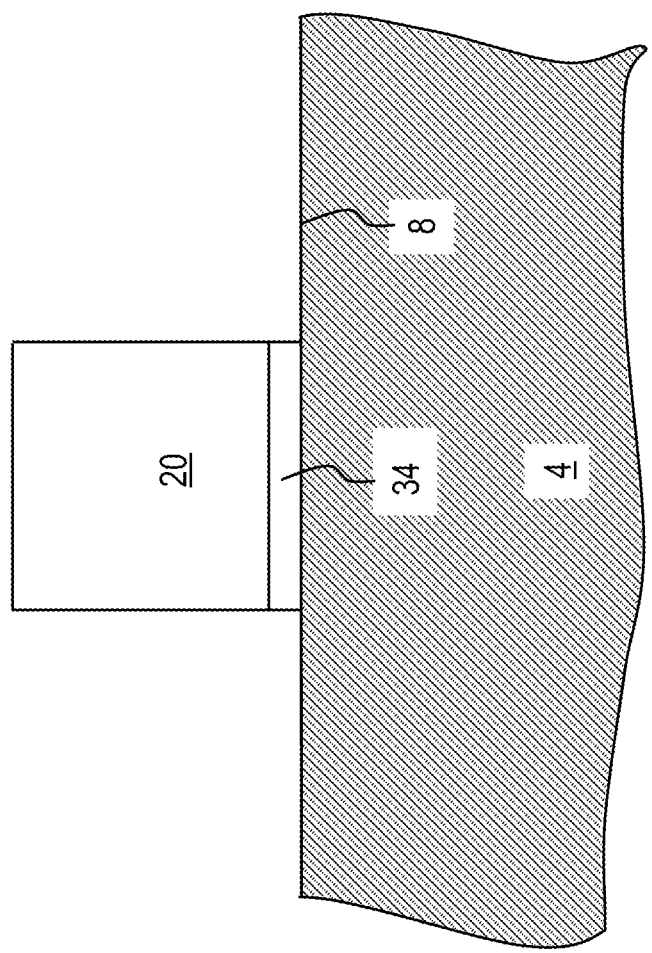
FIG. 2 is a cross-sectional view of a sacrificial gate structure taken generally along line 2-2 of FIG. 1.

FIG. 2 is a cross-sectional view taken generally along line 2-2 of FIG. 1 and illustrates only upper portions of the structure shown in FIG. 1. FIG. 2 shows sacrificial gate 20 disposed over top 8 of semiconductor fin 4. FIG. 2 also illustrates optional hard mask 34, which will have been formed prior to the formation of sacrificial gate 20 using conventional methods. In other exemplary embodiments, hard mask 34 may not be used. Although sacrificial gate 20 is only illustrated to be over top 8 of semiconductor fin 4 in FIG. 2 due to the cross section being taken as indicated with respect to FIG. 1, it should be understood that sacrificial gate 20 extends in and out of the plane of the drawing figure and along and past respective opposed sides 6 as can be seen in FIG. 1.

Figure 3:
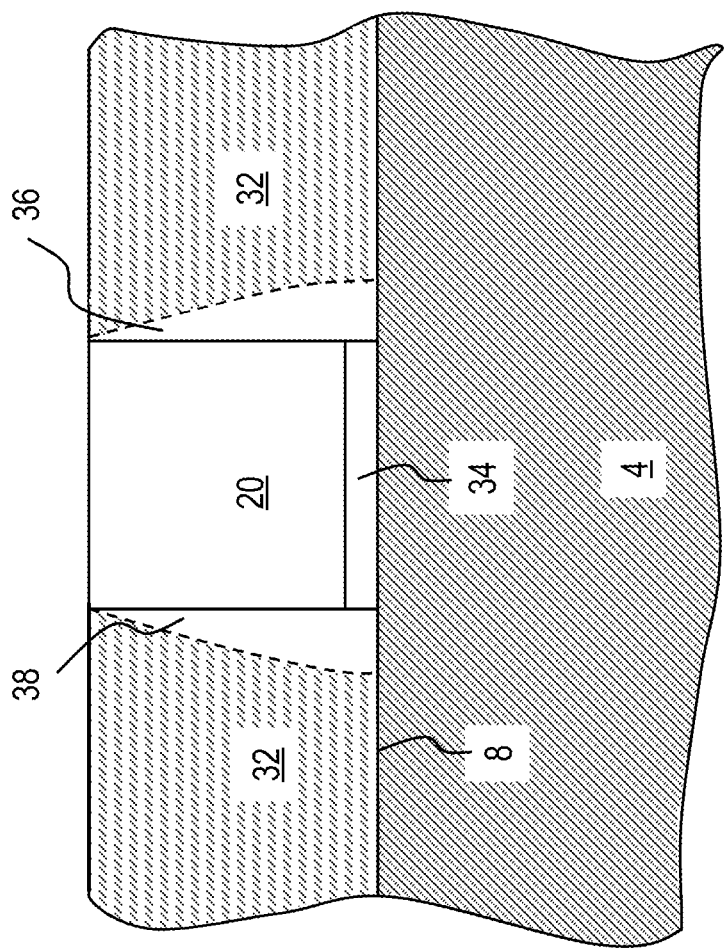
FIGS. 3-4 are cross sectional views showing subsequent processing operations performed on the structure shown in FIG. 2 to form and remove a replacement metal gate.

A blanket or other deposition operation may then be used to form a dielectric over the structure shown in FIG. 2 and this deposition process may be followed by a planarization process to produce the structure shown in FIG. 3. Interlevel dielectric 32 may be any of various suitable dielectrics used as ILD's, interlevel dielectrics or ND's, inter-metal dielectrics, suitably known in the semiconductor arts. Prior to the deposition of interlevel dielectric 32, optional spacers may be formed and optional spacers 38 are indicated by dash lines. Conventional methods and materials may be used in the formation of optional spacers 38. After planarization, top surface 36 is a generally planar surface and includes co-planar upper surfaces of interlevel dielectric 32 and sacrificial gate 20.

Figure 4:
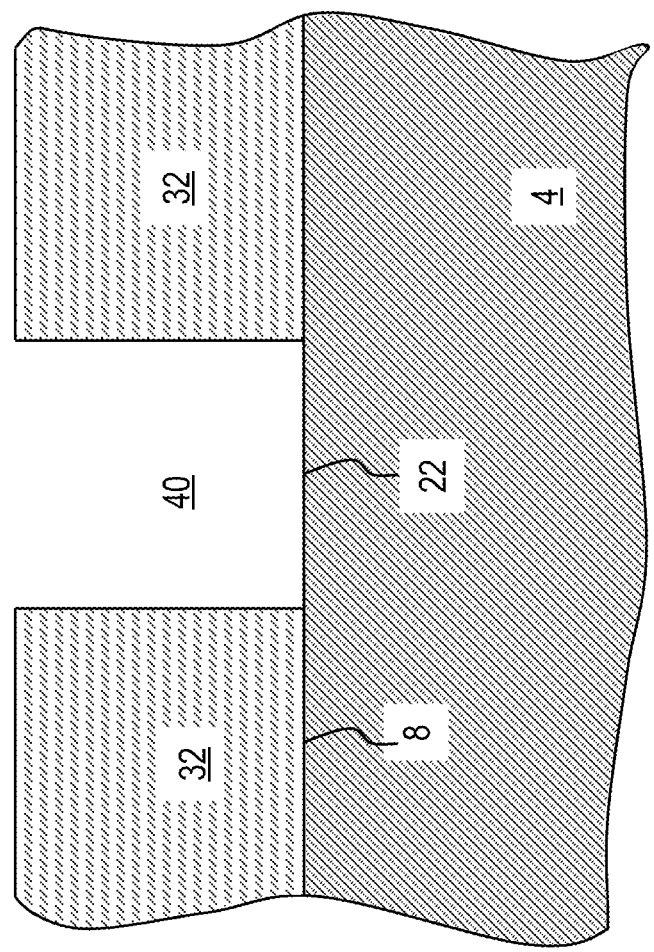

FIG. 4 shows the structure of FIG. 3 (without optional spacers 38) after a removal operation has been used. The removal operation sequentially removes sacrificial gate 20 and hardmask 34 thereby forming opening 40 within interlevel dielectric 32. Various processes may be used to selectively remove sacrificial gate 20 and then hardmask 34 to form opening 40 without attacking the underlying transistor channel 22. In various exemplary embodiments, wet chemical etching operations may be used, RIE (reactive ion etching) operations may be used, or various other suitable etching operations may be used. After sacrificial gate 20 is removed, stopping at hard mask 34 to avoid damaging the surfaces of transistor channel 22 of semiconductor fin 4, hard mask 34 is then removed to expose the transistor channel 22 surface portion of top 8 of semiconductor fin 4, as illustrated in FIG. 4, and also the portions of transistor channel 22 along sides 6 of semiconductor fin 4. Opening 40 within interlevel dielectric 32, which was formerly occupied by sacrificial gate 20, is bounded on its sides by interlevel dielectric 32 and subjacently by the surfaces of semiconductor fin 4 that form transistor channel 22.

Figure 5B:
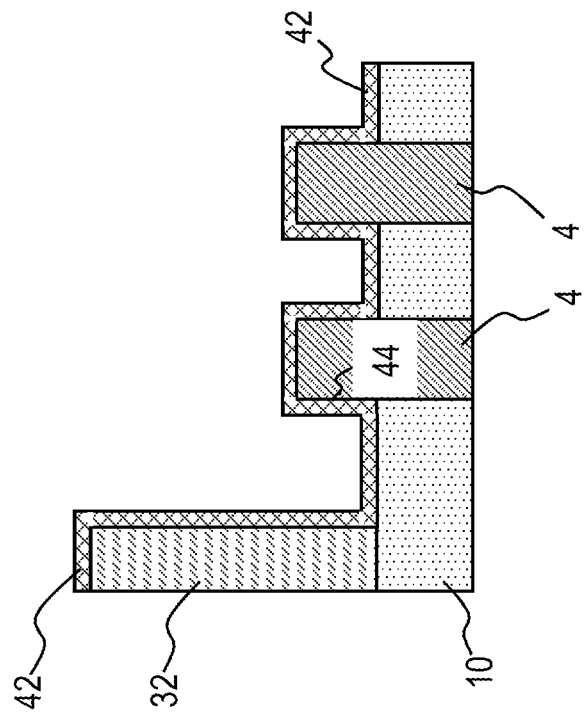
FIGS. 5a/5b-10a/10b are cross sectional views showing an embodiment of processing operations employed to produce a metal gate stressor.
Figure 5A:
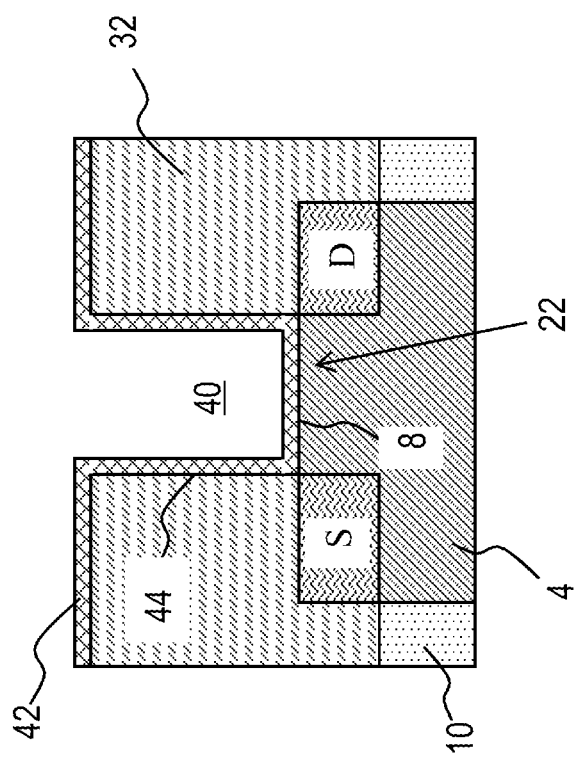

Referring now to FIGS. 5a-5b, X-cut and Y-cut cross-sectional views of an upper portion of a structure similar to that of FIG. 1 are provided. As shown in FIG. 5a, the structure depicted in the X-Cut includes the opening 40 and the interlevel dielectric 32 (similar to that of FIG. 4). However, for the purpose of illustration the X-Cut also illustrates the source S and drain D regions, the STI structure 10, and more of the fin 4. In addition, for the purpose of illustration the Y-Cut of FIG. 5b, which is transverse to the X-Cut, includes two of the fins 4 projecting above the STI structures 10.

As shown in FIG. 5a, and progressing from left to right in the figure, a gate layer 42 is formed on a top surface of the interlevel dielectric 32, along sidewalls 44 of the interlevel dielectric 32, on the top surface 8 of the fin 4 over the transistor channel 22, and then along the sidewalls 44 and over the top surface of the interlevel dielectric 32 again. As shown in FIG. 5b, and progressing from left to right in the figure, the gate layer 42 is formed on the top surface of the interlevel dielectric 32, on a top surface of the STI region 10, along sidewalls 44 of the fin 4, on the top surface 8 of the fin 4 above the transistor channel 22, back down along the sidewalls 44 of the fin 4, over the top surface of the STI region 10, along the sidewalls 44 of an adjacent fin 4, and so on.

In FIGS. 5a-5b, in an embodiment the gate layer 42 collectively represents an interfacial oxide layer, a high-k value dielectric layer, and a metal layer. The interfacial oxide layer may be deposited using, for example, an atomic layer deposition (ALD) process, a physical vapor deposition (PVD) process, a chemical oxide process, a low pressure chemical vapor deposition (LPCVD) process, or other suitable methods. The high-k dielectric may be deposited by, for example, the ALD process or other suitable methods.

Various materials may be used to form the dielectric portions of the gate layer 42 such as, for example, hafnium oxide ($HfO_2$), zirconium oxide ($ZrO_2$), or other suitable gate dielectric materials that have a desirably high dielectric constant k, i.e., higher than that of silicon dioxide ($SiO_2$). Various suitable thicknesses may be used and are chosen in conjunction with device speed and application.

Figure 6A:
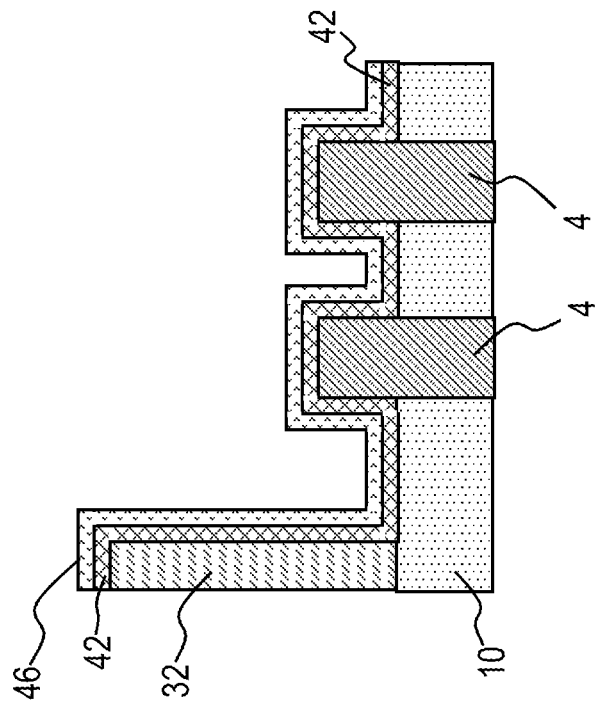
Figure 6B:
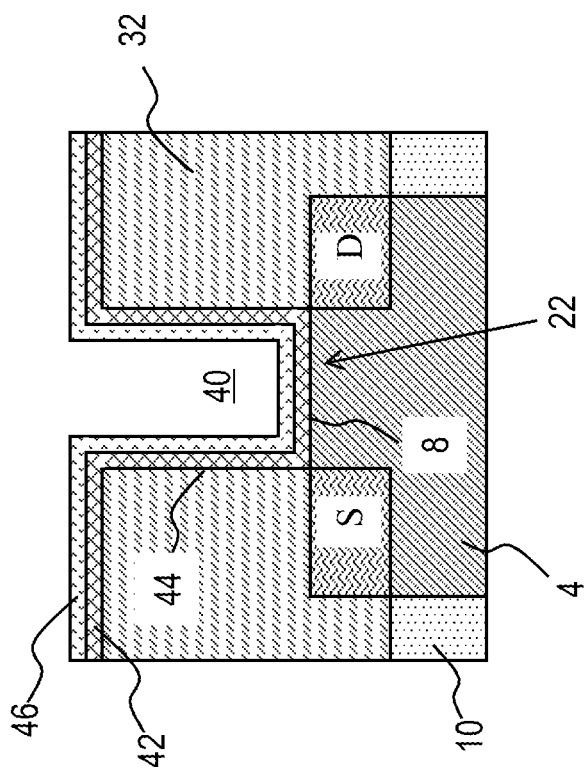

After the formation of the gate layer 42, a gate stressor layer 46 (a.k.a., a modification layer) is formed over the gate layer 42 as shown in FIGS. 6a-6b. In an embodiment, the gate stressor layer 46 is formed from titanium nitride (TiN) deposited using the ALD process to add tension to the transistor channel 22. In an embodiment, the gate stressor layer 46 is formed from titanium nitride (TiN) deposited using the PVD process to compress the transistor channel 22. In an embodiment, the gate stressor layer 46 may be conformal as shown in FIGS. 6a-6b. In another embodiment, the gate stressor layer 46 need not be conformal. In an embodiment, the gate stressor layer 46 may be formed from a doped material (e.g., a p-doped material). In an embodiment, the gate stressor layer 46 is formed from a dielectric material to, for example, control fin height.

After the gate stressor layer 46 has been formed, a spin on glass (SOG) layer 48 is formed over the gate stressor layer 46 as shown in FIGS. 7a-7b. The SOG layer 48 may be formed using an N or P patterning scheme. As shown in FIGS. 8a-8b, a dry etch procedure is used to remove an upper portion of the SOG layer 48 without attacking the underlying gate stressor layer 46.

As shown in FIGS. 8a-8b, a remaining portion of the SOG layer 48 is generally situated between adjacent fins 4 or between one of the fins 4 and the interlevel dielectric 32. In an embodiment, the remaining portion of the SOG layer 48 is disposed below, for example, a top surface 8 of the fin 4, a top surface of the gate layer 42 above the fin 4, or a top surface the gate stressor layer 46 above the fin 4. In another embodiment, the remaining portion of the SOG layer 48 has the same, or substantially the same, height as the top surface 8 of the fin 4, a top surface of the gate layer 42 above the fin 4, or a top surface of the gate stressor layer 46 above the fin 4.

Referring now to FIGS. 9a-9b, after the upper portion of the SOG layer 48 has been etched away, an upper portion of the gate stressor layer 46 is removed through a wet etch process, which leaves a gate stressor 50 (a.k.a., a gate modifier). As shown in FIG. 10b, one of the gate stressors 50 may be formed between the interlevel dielectric 32 and the adjacent fin 4. Another of the gate stressors 50 may be formed between adjacent fins 4. As shown, the gate stressor 50 generally includes vertically-oriented sidewalls 52 on opposing ends of a horizontally-oriented floor 54. The sidewalls 52 of the gate stressor 50 generally engage portions of the gate layer 42 disposed over the sidewalls 44 of the fin 4 and/or the interlevel dielectric 32. In addition, in an embodiment the floor 54 of the gate stressor 50 generally engages the portion of the gate layer 42 disposed over the top surface of the STI region 10.

The height of the sidewalls 52 of the gate stressor 50 may be precisely controlled through the wet etch process. While the gate stressor 50 of FIG. 9b has been depicted as having a ninety degree angle between the sidewalls 52 and the floor 54, those skilled in the art will recognize and appreciate that the transition between the sidewalls 52 and the floor 54 may be more gradual. Indeed, in practical applications the gate stressor 50 may have somewhat rounded internal corners.

In an embodiment, a top surface of the sidewalls 52 of the gate stressor 50 and a top surface of the remaining portions of the SOG layer 48 are generally co-planar as shown in FIG. 9b.

In other words, the sidewalls 52 of the gate stressor 50 and the remaining portions of the SOG layer 48 have approximately the same height.

By putting the transistor channel 22 in tension, the channel NMOS (i.e., the ID FET) performance may be enhanced. By compressing the transistor channel 22, the PMOS channel may be enhanced. In either case, the gate stressor 50 generally improves carrier mobility in a FinFET structure.

Referring now to FIGS. 10a-10b, after the upper portions of the gate stressor layer 48 have been removed and the gate stressor 50 formed, the remaining portions of the SOG layer 48 are removed through an additional patterning and dry etch process. As shown in FIG. 10b, the gate stressor 50 remains intact after the dry etch process. In an embodiment, a highly selective wet etch process may be utilized. In an embodiment, tantalum nitride (TaN) may be employed as an etch stop layer during the wet etch process.

Referring now to FIGS. 11a-11b, in an embodiment a work function metal 56 is added to improve the work function and/or to alter the threshold voltage of the device. As shown in FIGS. 11a-11b, the work function metal 56 is formed over and upon the gate layer 42 and the gate stressor 50. In an embodiment, the work function metal 56 is TiN, TaN, or titanium aluminum nitride (TiAlN). The work function metal 56 may be deposited using an ALD, PVD, CVD, or other suitable process. In an embodiment, the work function metal 56 may be deposited over or around one of the fins 4 having a first doping (either P or N) while an adjacent fin 4 with an opposite doping (either N or P) is protected. Thereafter, the work function metal 56 is deposited over or around the opposite fin 4 while the initial fin 4, which was previously covered with the work function metal 56, is protected.

After the work function metal 56 has been provided, aluminum 58 or another suitable metal is deposited over the work function metal 56. The aluminum 58 may be deposited using an ALD, PVD, or other suitable process. After the aluminum 58 is formed over the work function metal 56, a chemical mechanical planarization (CMP) process may be performed to provide the structure of FIGS. 11a-11b with a generally smooth or planar top surface.

Figure 12:
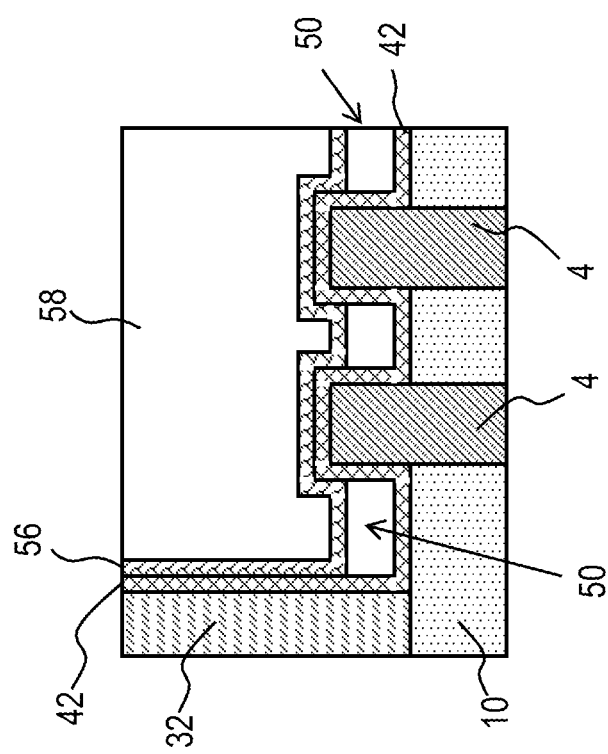
FIG. 12 is a cross section of an embodiment of the gate stressor of FIG. 10b where sidewalls are permitted to merge together.

Referring now to FIG. 12, in an embodiment the process of forming the gate stressor 50 (see FIGS. 6a-6b) may be continued until the opposing sidewalls 52 (see FIG. 11b) of the gate stressor 50 merge together. As shown, this forms a thicker layer of gate stressor 50 between adjacent fins 4 or between the ILD 32 and one of the fins 4 (relative to the thinner gate stressor 50 of FIGS. 6a-6b). In some circumstances, the sidewalls 52 of the gate stressor 50 merge when the space between adjacent fins 4 is limited.

Those skilled in the art will appreciate that the gate stressor 50 disclosed herein provides numerous advantages. For example, the gate stressor 50 boosts channel 22 performance and permits tuning of multiple threshold voltages on a Fin structure. In addition, in an embodiment where the gate stressor 50 and any subjacent layers are a dielectric, precise fin height control may be achieved.

Figure 13:
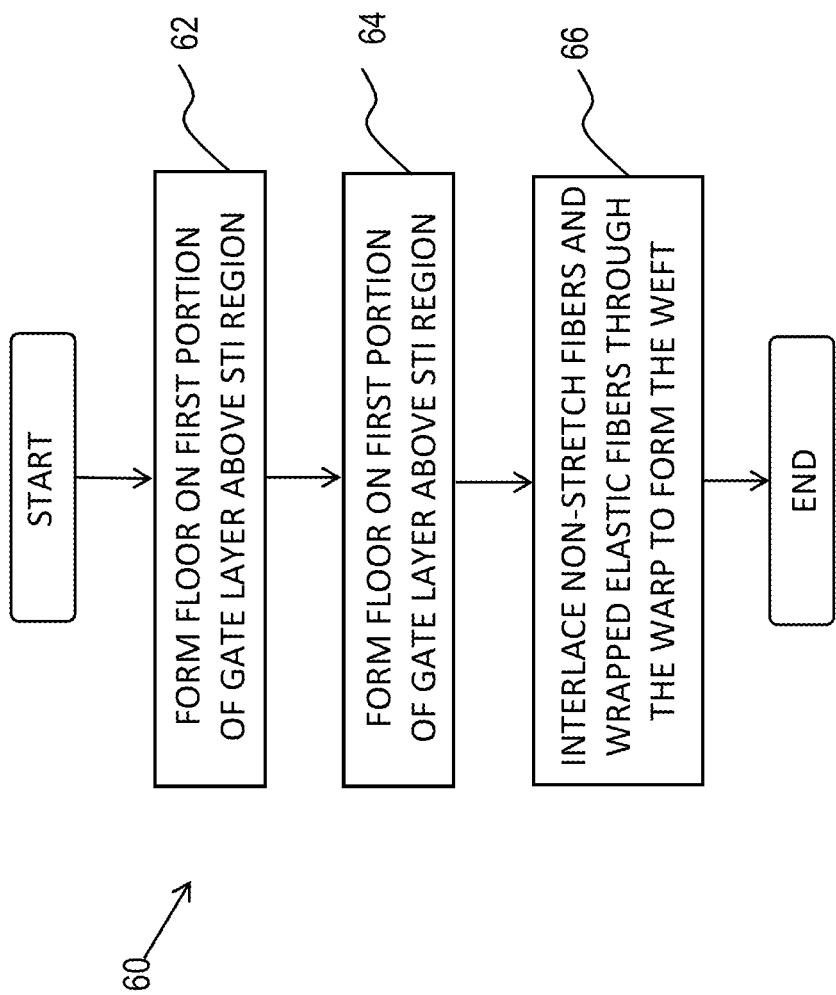
FIG. 13 is an embodiment of a method of forming the gate stressor of FIG. 10b.

Referring now to FIG. 13, a method 60 of forming the gate stressor 50 is illustrated. In block 62, a floor is formed on a first portion of a gate layer 42, which is disposed above the STI region 10. In block 64, a first stressor sidewall 50 is formed on a second portion of the gate layer 42. The second portion of the gate layer 42 is disposed on sidewalls 44 of the fin 4. In block 66, a second stressor sidewall 50 is formed on a third portion of the gate layer 42. The third portion of the gate layer 42 is disposed on a structure sidewall of a structure (e.g., the interlevel dielectric 32, an adjacent fin 4, etc.) spaced apart from the fin 4. In an embodiment, the first stressor side wall and the second stressor sidewall do not exceed the height 14 (FIG. 1) of the fin 4.

A gate stressor for a field effect transistor (FinFET) device. The gate stressor comprises a floor formed on a first portion of a gate layer, the gate layer disposed above a shallow trench isolation (STI) region, a first stressor sidewall formed on a second portion of the gate layer, the second portion of the gate layer disposed on a fin sidewall, and a second stressor sidewall formed on a third portion of the gate layer, the third portion of the gate layer disposed on a structure sidewall of a structure spaced apart from the fin, the first stressor sidewall and the second stressor sidewall not exceeding a height of the fin.

A field effect transistor (FinFET) device. The device comprises a fin providing a transistor channel, a structure spaced apart from the fin by a shallow trench isolation (STI) region, a gate layer formed over the structure, the STI region, the fin, and a gate stressor formed over a first portion of the gate layer disposed on the STI region between the structure and the fin, and formed over a second portion of the gate layer disposed on sidewalls of the fin and sidewalls of the structure.

A method of forming a gate stressor for a field effect transistor (FinFET) device. The method comprises forming a floor on a first portion of a gate layer, the gate layer disposed above a shallow trench isolation (STI) region, forming a first stressor sidewall on a second portion of the gate layer, the second portion of the gate layer disposed on sidewalls of a fin, and forming a second stressor sidewall on a third portion of the gate layer, the third portion of the gate layer disposed on sidewalls of a structure spaced apart from the fin, the first stressor sidewall and the second stressor sidewall not exceeding a height of the fin.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming a fin field effect transistor (FinFET) device, the method comprising:
   providing a substrate having a dielectric layer formed thereon, the substrate having a first fin extending through the dielectric layer;
   forming a forming a gate layer over the first fin and an upper surface of the dielectric layer;
   forming a gate stressor layer over the gate layer along sidewalls of the first fin, an uppermost surface of the gate stressor layer being lower than an uppermost surface of the first fin; and
   forming a gate electrode over the gate stressor layer and the first fin.

2. The method of claim 1, further comprising forming the gate stressor layer using an atomic layer deposition process to provide tensile stress to a transistor channel.

3. The method of claim 1, further comprising forming the gate stressor layer using a physical vapor deposition process to provide compressive stress to a transistor channel.

4. The method of claim 1, wherein the gate layer comprises an interfacial layer, a high-K dielectric layer over the interfacial layer, and a metal layer over the high-K dielectric layer.

5. The method of claim 1, wherein the gate stressor layer comprises a metal.

6. The method of claim 1, wherein the gate stressor layer has a planar upper surface.

7. The method of claim 1, wherein the gate stressor layer has a non-planar upper surface.

8. A method of forming a fin field effect transistor (FinFET) device, the method comprising:
   providing a substrate having a first fin extending through a dielectric layer;
   forming a gate layer over the first fin and an upper surface of the dielectric layer, the gate layer extending over an upper surface of the first fin;
   forming a gate stressor layer over the gate layer above the dielectric layer and along sidewalls of the first fin, the gate stressor layer extending over the gate layer along an upper surface of the first fin;
   forming a mask layer over the gate stressor layer, the mask layer having a first opening, the first opening exposing a first exposed portion of the gate stressor layer along an uppermost portion of the first fin;
   removing the first exposed portion of the gate stressor layer;
   removing the mask layer; and
   forming a gate electrode over the gate stressor layer and the first fin.

9. The method of claim 8, further comprising a second fin, wherein the forming the gate stressor layer comprises forming the gate stressor layer over the first fin and the second fin, the gate stressor layer extending continuously over the first fin and the second fin, wherein the mask layer further has a second opening exposing a second exposed portion of the gate stressor layer along an uppermost portion of the second fin, and wherein the removing comprises removing the second exposed portion of the gate stressor layer.

10. The method of claim 9, wherein the gate stressor layer has a "U" shape between the first fin and the second fin.

11. The method of claim 9, wherein, prior to the removing the first exposed portion and the second exposed portion, the gate stressor layer fills a space between the first fin and the second fin.

12. The method of claim 8, further comprising forming the gate stressor layer provides tensile stress to a transistor channel.

13. The method of claim 8, further comprising forming the gate stressor layer provides compressive stress to a transistor channel.

14. The method of claim 8, wherein the gate stressor layer has a non-planar upper surface.

15. A method of forming a fin field effect transistor (FinFET) device, the method comprising:
   forming a floor on an upper surface of a gate layer, the gate layer disposed above a shallow trench isolation (STI) region;
   forming a first stressor sidewall on the upper surface of the gate layer and along a first sidewall of the gate layer, the first sidewall of the gate layer disposed on a fin sidewall; and
   forming a second stressor sidewall on the upper surface of the gate layer and along a second sidewall of the gate layer, the second sidewall of the gate layer disposed on sidewalls of a structure spaced apart from the fin, the first stressor sidewall and the second stressor sidewall not exceeding a height of the fin.

16. The method of claim 15, wherein the structure is a second fin.

17. The method of claim 15, wherein the structure is an interlevel dielectric.

18. The method of claim 15, wherein the first stressor sidewall directly contacts the second stressor sidewall.

19. The method of claim 15, further comprising forming the first stressor sidewall and the floor provide tensile stress to a transistor channel.

20. The method of claim 15, further comprising forming the first stressor sidewall and the floor provide compressive stress to a transistor channel.

* * * * *